(12) United States Patent
Choi et al.

(10) Patent No.: US 8,526,750 B2
(45) Date of Patent: Sep. 3, 2013

(54) METHOD AND APPARATUS FOR ENCODING/DECODING IMAGE BY USING ADAPTIVE BINARIZATION

(75) Inventors: Jong-bum Choi, Suwon-si (KR); Sung-bum Park, Seongnam-si (KR); Woo-sung Shim, Suwon-si (KR); Young-ho Moon, Suwon-si (KR); Dai-woong Choi, Seoul (KR); Jae-won Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 978 days.

(21) Appl. No.: 12/551,691

(22) Filed: Sep. 1, 2009

(65) Prior Publication Data

US 2010/0054615 A1    Mar. 4, 2010

(30) Foreign Application Priority Data

Sep. 2, 2008 (KR) .................. 10-2008-0086285

(51) Int. Cl.
*G06K 9/36* (2006.01)
(52) U.S. Cl.
USPC .......................................... 382/238; 382/232
(58) Field of Classification Search
USPC ......... 382/232–233, 236–237, 239, 246–247, 382/251; 341/50; 375/240.12, 240.24
See application file for complete search history.

(56) References Cited

U.S. PATENT DOCUMENTS

2006/0158355 A1 * 7/2006 Jeon et al. ................. 341/50
2007/0110153 A1 * 5/2007 Cho et al. ............. 375/240.12

* cited by examiner

*Primary Examiner* — Duy M Dang
(74) *Attorney, Agent, or Firm* — Sughrue Mion, PLLC

(57) ABSTRACT

A method and apparatus for encoding/decoding an image, wherein the method includes selecting a predetermined binarization table from a plurality of binarization tables based on prediction values of a current pixel and binarizing or inversely binarizing residual values by using the selected binarization table.

22 Claims, 7 Drawing Sheets

| PREDICTION VALUE | RANGE OF RESIDUAL VALUE |
|---|---|
| 0 | 0 ~ 15 |
| 1 | −1 ~ 14 |
| 2 | −2 ~ 13 |
| 3 | −3 ~ 12 |
| 4 | −4 ~ 11 |
| ... | ... |

FIG. 3

| | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| BINARIZATION TABLE 1 | RESIDUAL VALUE | 0 | 1 | 2 | 3 | 4 | 5 | 6 | 7 | 8 | 9 | 10 | 11 | 12 | 13 | 14 | 15 |
| | BINARY STRING | 0000 | 0001 | 0010 | 0011 | 0100 | 1010 | 0110 | 0111 | 1000 | 1001 | 1010 | 1011 | 1100 | 1101 | 1110 | 1111 |
| BINARIZATION TABLE 2 | RESIDUAL VALUE | 0 | −1 | 1 | 2 | 3 | 4 | 5 | 6 | 7 | 8 | 9 | 10 | 11 | 12 | 13 | 14 |
| | BINARY STRING | 0000 | 0001 | 0010 | 0011 | 0100 | 1010 | 0110 | 0111 | 1000 | 1001 | 1010 | 1011 | 1100 | 1101 | 1110 | 1111 |
| BINARIZATION TABLE 3 | RESIDUAL VALUE | 0 | −1 | 1 | −2 | 2 | 3 | 4 | 5 | 6 | 7 | 8 | 9 | 10 | 11 | 12 | 13 |
| | BINARY STRING | 0000 | 0001 | 0010 | 0011 | 0100 | 1010 | 0110 | 0111 | 1000 | 1001 | 1010 | 1011 | 1100 | 1101 | 1110 | 1111 |
| BINARIZATION TABLE 4 | RESIDUAL VALUE | 0 | −1 | 1 | −2 | 2 | −3 | 3 | 4 | 5 | 6 | 7 | 8 | 9 | 10 | 11 | 12 |
| | BINARY STRING | 0000 | 0001 | 0010 | 0011 | 0100 | 1010 | 0110 | 0111 | 1000 | 1001 | 1010 | 1011 | 1100 | 1101 | 1110 | 1111 |
| BINARIZATION TABLE 5 | RESIDUAL VALUE | 0 | −1 | 1 | −2 | 2 | −3 | 3 | −34 | 4 | 5 | 6 | 7 | 8 | 9 | 10 | 11 |
| | BINARY STRING | 0000 | 0001 | 0010 | 0011 | 0100 | 1010 | 0110 | 0111 | 1000 | 1001 | 1010 | 1011 | 1100 | 1101 | 1110 | 1111 |
| ⋯ | | | | | | | | | | | | | | | | | |

FIG. 4

| PREDICTION VALUE | RANGE OF RESIDUAL VALUE | SIGN BIT (NEEDED) | SIGN BIT (NOT NEEDED) |
|---|---|---|---|
| 0 | 0 ~ 15 |  | 0 ~ 15 |
| 1 | -1 ~ 14 | 1, -1 | 0, 2~14 |
| 2 | -2 ~ 13 | 1, -1, -2, 2 | 0, 3~14 |
| 3 | -3 ~ 12 | 1, -1, -2, 2, -3, 3 | 0, 4~14 |
| 4 | -4 ~ 11 | 1, -1, -2, 2, -3, 3, -4, 4 | 0, 5~14 |
| ... | ... | ... | ... |

METHOD AND APPARATUS FOR ENCODING/DECODING IMAGE BY USING ADAPTIVE BINARIZATION

CROSS-REFERENCE TO RELATED PATENT APPLICATIONS

This application claims the benefit of Korean Patent Application No. 10-2008-0086285, filed on Sep. 2, 2008, in the Korean Intellectual Property Office, the disclosure of which is incorporated herein in its entirety by reference.

BACKGROUND OF THE INVENTION

1. Field of the Invention

Methods and apparatuses consistent with the present invention relate to encoding/decoding an image.

2. Description of the Related Art

In image compression methods such as MPEG-1, MPEG-2, and MPEG-4 H.264/MPEG-4 advanced video coding (AVC), one picture is divided into predetermined image processing units, for example, into macroblocks, so as to encode an image. Next, each macroblock is encoded by using inter prediction or intra prediction. Then, an optimum encoding mode is selected in consideration of the data size of an encoded macroblock and the degree of distortion of an original macroblock, and the macroblock is encoded.

When a prediction block of a current block is generated as a result of inter prediction or intra prediction, a residual block is generated by subtracting the prediction block from the current block.

Residual values of the residual block undergo discrete cosine transformation (DCT) and are converted into a frequency domain. Discrete cosine coefficients that are generated as a result of DCT are quantized. The quantized discrete cosine coefficients are entropy encoded by performing binarization and arithmetic encoding so that image data can be generated. In H.264/AVC encoding, entropy encoding is performed by context-adaptive variable length coding (CAVLC) or context-adaptive binary arithmetic coding (CABAC). Entropy encoding is performed by applying a discrete entropy encoding method to each syntax element.

DCT coefficients among a plurality of syntax elements are used to perform context-based binary arithmetic coding by run-level encoding. The case where the value of a DCT coefficient is '0' is referred to as run, and the case where the value of a DCT coefficient is not '0' is referred to as level. These DCT coefficients are divided into run and level and are binarized. Binary strings that are generated as a result of binarization are arithmetic coded by using a predetermined context model.

In this case, DCT coefficients which are not '0', i.e., levels, are firstly binarized as variable length codes by using concatenated unary/k-th order exponential Golomb binarization, and binary strings that are generated as a result of binarization are arithmetic coded.

Some blocks do not undergo DCT, and residual values included in the residual block are directly entropy encoded. When it is determined that it is more efficient to entropy encode residual values than to perform DCT on the residual values as a result of the data size and the degree of distortion of an original macroblock, i.e., as a result of calculating an R-D cost, a DCT operation is omitted. Such an encoding mode is referred to as a by-pass mode. The case where encoding is performed in a by-pass mode and a quantization parameter (qP) is 0 is referred to as lossless encoding. Residual values during by-pass mode encoding are binarized using an exponential Golomb binarization method like in the case of DCT coefficients and are arithmetic coded.

SUMMARY OF THE INVENTION

Exemplary embodiments of the present invention provide a method and apparatus for encoding/decoding an image, and more particularly, to a method and apparatus for encoding/decoding residual values.

Exemplary embodiments of the present invention also provide a computer readable recording medium having recorded thereon a program for executing the method.

According to an aspect of the present invention, there is provided a method of encoding an image, the method including: selecting a binarization table for binarizing a residual value that is obtained by subtracting a prediction value of a current pixel from a pixel value of the current pixel, from a plurality of binarization tables based on the prediction value of the current pixel; binarizing the residual value by using the selected binarization table and generating a binary string; and arithmetic coding the binary string.

The selecting of the binarization table may include selecting a binarization table in which values in a range where the values are smaller than or equal to a value that is obtained by subtracting prediction value from the maximum value of the pixel value of a current pixel and where the values are greater than or equal to a negative value of the prediction value, are made to correspond to predetermined binary strings.

The binary strings may be binary strings having the same number of bits.

The binary string corresponding to the residual value having an absolute value that is smaller than or equal to an absolute value of the prediction value may include sign bits.

The generating of the binary string may include: determining the number of bits that are needed to binarize the residual values based on a largest residual value among the residual values of a current block; and binarizing the residual value of the current pixel into a binary string having the determined number of bits by using the selected binarization table.

The arithmetic coding of the binary strings may include arithmetic coding a lower bit included in the generated binary string by using a context model which is different according to a binary value of upper bits.

According to another aspect of the present invention, there is provided an apparatus for encoding an image, the apparatus including: a binarization control unit selecting a binarization table for binarizing a residual value that is obtained by subtracting a prediction value of a current pixel from a pixel value of the current pixel, from a plurality of binarization tables based on the prediction value of the current pixel; a binarization unit binarizing the residual value by using the selected binarization table and generating a binary string; and an arithmetic coding unit arithmetic coding the binary string.

According to another aspect of the present invention, there is provided a method of decoding an image, the method including: receiving data about a residual value that are obtained by subtracting a prediction value of a current pixel from a pixel value of the current pixel, arithmetic decoding the received data, and generating a binary string with respect to the residual value; selecting a binarization table for inversely binarizing the residual value from a plurality of binarization tables based on the prediction value of the current pixel; and inversely binarizing the binary string by using the selected binarization table.

According to another aspect of the present invention, there is provided an apparatus for decoding an image, the apparatus including: an arithmetic decoding unit receiving data about a residual value that is obtained by subtracting a prediction value of a current pixel from a pixel value of the current pixel, arithmetic decoding the received data, and generating a binary string with respect to the residual value; an inverse binarization control unit selecting a binarization table for inversely binarizing the residual value from a plurality of binarization tables based on the prediction value of the current pixel; and an inverse binarization unit inversely binarizing the binary string by using the selected binarization table.

A computer readable recording medium having recorded thereon a program for executing the method of encoding an image or the method of decoding an image, is another aspect of the present invention.

BRIEF DESCRIPTION OF THE DRAWINGS

The above and other features and aspects of the present invention will become more apparent by describing in detail exemplary embodiments thereof with reference to the attached drawings in which:

FIG. 3 illustrates a plurality of binarization tables according to an exemplary embodiment of the present invention;

FIG. 4 illustrates residual values that require sign bits, according to an exemplary embodiment of the present invention;

DETAILED DESCRIPTION OF THE INVENTION

Hereinafter, the present invention will be described in detail by explaining exemplary embodiments of the invention with reference to the attached drawings.

Figures 1, 2:
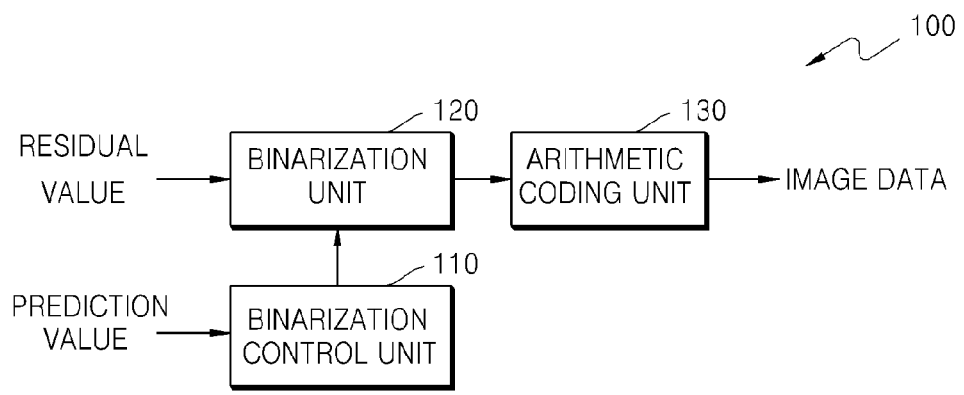
FIG. 1 illustrates an apparatus for encoding an image according to an exemplary embodiment of the present invention.
FIG. 2 illustrates a range of a residual value according to an exemplary embodiment of the present invention.

FIG. 1 illustrates an apparatus 100 for encoding an image according to an exemplary embodiment of the present invention. Referring to FIG. 1, the apparatus 100 for encoding an image according to the current exemplary embodiment includes a binarization control unit 110, a binarization unit 120, and an arithmetic coding unit 130.

The binarization control unit 110 selects a binarization table for binarizing a residual value of a current pixel from a plurality of binarization tables based on a prediction value of a current pixel. Here, the residual value is obtained by subtracting the prediction value from a pixel value of the current pixel. The maximum value of the pixel value is determined according to the number of bits in a binary string. Thus, a range of the residual value is determined according to the prediction value. Thus, when a binarization table in which only values in the range that is determined based on the prediction value correspond to binary strings, is selected, the values can be binarized by using less bits, which will be described in detail with reference to FIG. 2.

FIG. 2 illustrates the range of a residual value according to an exemplary embodiment of the present invention.

FIG. 2 illustrates the case where a pixel value are expressed using binary strings containing 4 bits. Since the pixel values are expressed as binary strings containing 4 bits, the maximum value of the pixel value is 15. Since a residual value is obtained by subtracting a prediction value of the current pixel from the pixel value of the current pixel, when the prediction value is 0, the residual value may be in the range of 0 to 15, and when the prediction value is 1, the residual value may be in the range of −1 to 14. Briefly, the range of the residual value is determined according to the prediction value. The residual value may be binarized using a binary string of less bits as the values which must correspond to the binary strings decreases during binarization. Thus, when the residual value is binarized using a binarization table in which only the values in the range that is determined based on the prediction value correspond to predetermined binary strings, the number of bits consumed in binarization of the residual value can be reduced.

In this case, the number of bits in the binary strings to which the residual value corresponds, is determined based on the number of the values included in the range of the residual value. In the example illustrated in FIG. 2, the range of the residual value is changed depending on the prediction value. However, since the number of the values included in the range of the residual value is always 16, the residual value may be expressed in a binary string containing 4 bits. In order to binarize the residual value having different ranges in binary strings containing 4 bits, the binarization table is adaptively changed and the residual value are expressed by using less bits, which will be described in detail with reference to FIG. 3.

FIG. 3 illustrates a plurality of binarization tables according to an exemplary embodiment of the present invention.

Referring to FIG. 3, the plurality of binarization tables make the residual value in different ranges correspond to binary strings having the same number of bits according to the prediction value. As described previously with reference to FIG. 2, the residual value is smaller than or equal to a value that is obtained by subtracting the prediction value from the maximum value of the pixel value or is greater than or equal to a negative value of the prediction value. For example, when the prediction value is 4, the residual value are smaller than or equal to 11, which is the value that is obtained by subtracting 4, the prediction value, from 15, the maximum value of the pixel value, and the negative value of the prediction value is greater than or equal to −4. Since the range of the residual value is −4 to 11, the binarization control unit 110 selects a binarization table 5 which makes the values from −4 to 11 correspond to the binary strings. In the plurality of binarization tables illustrated in FIG. 3, ranges of the residual value are different. However, the number of values included in different ranges is 16, and the values are expressed using binary strings containing 4 bits.

As in the related art, when the residual value is binarized using an exponential Golomb binarization method, the residual value having high occurrence probabilities is expressed as a binary string containing less bits, and the residual value having low occurrence probabilities are expressed as a binary string containing more bits. However, in the residual value, a difference in occurrence probabilities is not larger than a difference in a discrete cosine transformation (DCT) coefficient. Thus, when the residual value is encoded using the exponential Golomb binarization method, the case may be inefficient. Thus, as illustrated in FIG. 3, the residual values are made to correspond to the binary strings having the same number of bits, and the range of the residual value to be binarized is changed according to a prediction value and is made to correspond to the binary strings, so as to minimize the number of bits in the binary strings.

According to another exemplary embodiment of the present invention, the binarization control unit 110 may sort a portion of the residual values that require sign bits based on the prediction value, which will be described in detail with reference to FIG. 4.

FIG. 4 illustrates residual values that require sign bits, according to an exemplary embodiment of the present invention.

Like FIG. 2, FIG. 4 illustrates the case where a pixel value is expressed using binary strings containing 4 bits. Referring to FIG. 4, the range of the residual value varies according to the prediction value, and a negative residual value may also exist. For example, when the prediction value is 1, the range of the residual value is −1 to 14, and binary strings which correspond to the residual values −1 and 1 having absolute values that are smaller than or equal to absolute value of the prediction value, require sign bits.

In the related by-pass mode encoding method, when residual values are encoded using entropy encoding, the residual values are encoded by adding information about signs of all of the residual values, i.e., sign bits. For example, a syntax "coeff_sign_flag" in a H.264 context-based adaptive binary arithmetic code (CABAC) is encoded together with the absolute values of the residual values with respect to all pixels.

However, according to an exemplary embodiment of the present invention, when the residual value is binarized, as illustrated in FIG. 4, the sign bits do not need to be added always to binary strings, and the sign bits are added only to binary strings corresponding to a portion of the values having negative values according to the prediction value. To this end, the binarization control unit 110 selects a binarization table including sign bits only in binary strings corresponding to the values having absolute values that are smaller than or equal to absolute value of the prediction value.

FIGS. 2, 3, and 4 illustrate the case where the pixel value is expressed using the binary string containing 4 bits. However, the present exemplary embodiment of the invention can also be applied to the case where the pixel value is expressed using binary string having a different number of bits. For example, even when the pixel value is expressed using a binary string containing 8 or 16 bits, the exemplary embodiment of the present invention can be applied to all of methods and apparatuses for binarizing and arithmetic coding a residual value based on a prediction value, and it will be easily understood by one of ordinary skill in the art. As illustrated in FIGS. 2 through 4, the residual value is made to correspond to a binary string containing the least number of bits based on the prediction value so that an encoding efficiency of the residual value is enhanced.

When the binarization control unit 110 selects the binarization table for binarizing the residual value of the current pixel based on the prediction value, the binarization unit 120 binarizes the residual value by using the selected binarization table to generate a binary string with respect to the current pixel. The binarization is performed repeatedly until all residual values of the current block are binarized.

As described previously with reference to FIGS. 2 and 3, the residual value of the current pixel is binarized using the binarization table in which values in the range where the values are smaller than or equal to value that is obtained by subtracting a prediction value from the maximum value of the pixel value and where the values are greater than or equal to a negative value of the prediction value, are made to correspond to predetermined binary strings.

In addition, as described previously with reference to FIG. 4, the residual value may be binarized using the binarization table including sign bits only in binary strings corresponding to values having absolute values that are smaller than or equal to an absolute value of a prediction value.

Figures 5, 6:
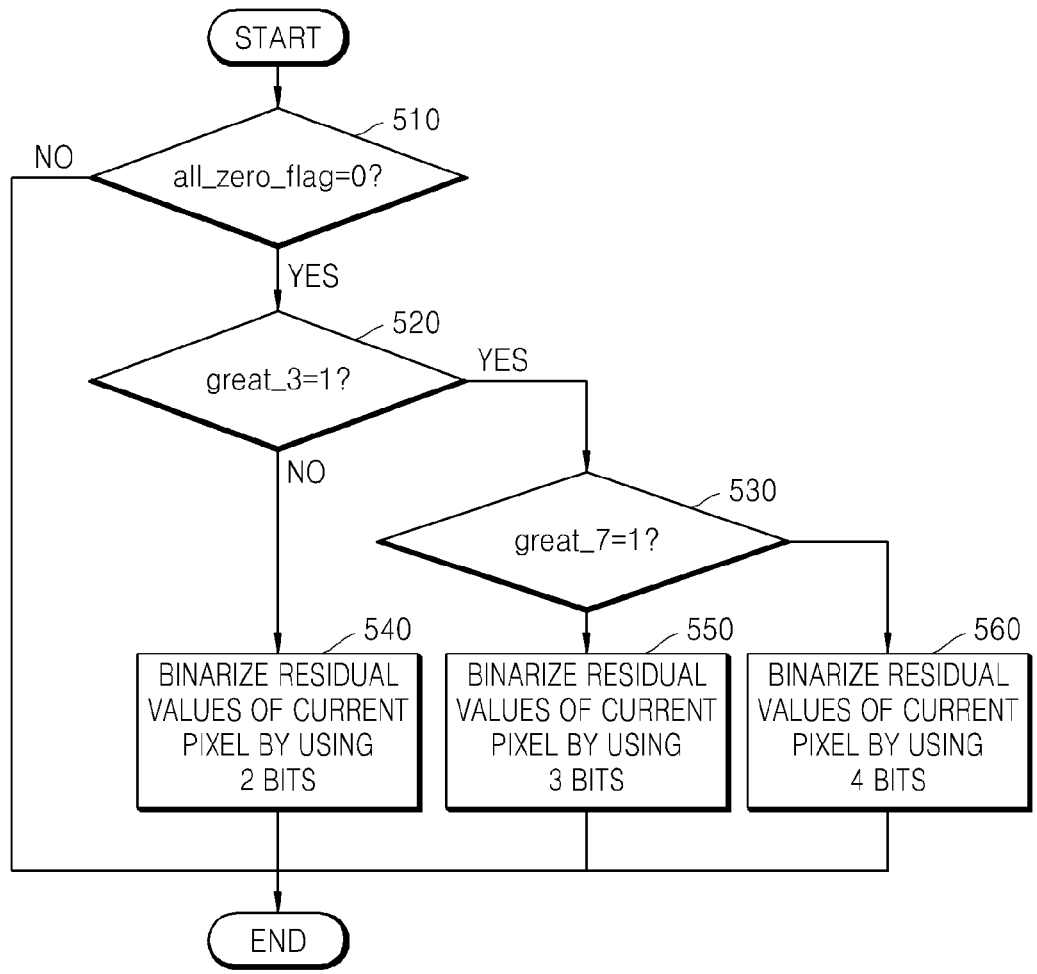
FIG. 5 illustrates a binarization method according to an exemplary embodiment of the present invention.
FIG. 6 illustrates contexts of arithmetic coding according to an exemplary embodiment of the present invention.

FIG. 5 illustrates a binarization method according to an exemplary embodiment of the present invention.

FIG. 5 illustrates a method of minimizing the number of bits in a binary string that are used to binarize the current pixel based on the largest residual value among residual values of a current block in which the current pixel is included.

Operations 510 to 530 are operations of determining the number of bits in binary strings that are needed to binarize residual values of the current block based on the largest residual value among the residual values of the current block.

In operation 510, the binarization unit 120 determines whether the residual values exist in the current block in which the current pixel is included. A syntax "all_zero_flag" is a syntax for determining whether all of the residual values of the current block are 0. When the residual values do not exist in the current block, i.e., when all of the residual values are 0, the syntax "all_zero_flag" is set to 1, and when a residual value exists in the current block, the syntax "all_zero_flag" is set to 0.

When it is determined that the residual values exist in the current block as a result of the determination of operation 510, in operation 520, the binarization unit 120 determines whether a syntax "great_3" is 1. The syntax "great_3" is a syntax for determining whether residual values of the current block can be expressed as 2 bits. The syntax "great_3" is set to 0 when the residual values of the current block can be expressed as 2 bits and is set to 1 when the residual values of the current block cannot be expressed as 2 bits. This will be described with reference to the binarization tables of FIG. 3.

In the example illustrated in FIG. 3, when the binary strings corresponding to all of the residual values of the current block are 0011, i.e., are smaller than a decimal number 3, the residual values can be expressed only as 2 bits. For example, when a prediction value is 0, the binarization control unit 110 selects a binarization table 1. Thus, when the largest residual value among the residual values of the current block is smaller than or equal to 3, the residual values of the current block can be expressed as 2 bits. Therefore, when the largest residual value is smaller than or equal to 3, the syntax "great_3" is set to 0.

In the same manner, when the prediction value is 1, the binarization control unit 110 selects a binarization table 2. Thus, when the largest residual value among the residual values of the current block is smaller than or equal to 2, the residual values of the current block can be expressed as 2 bits. Therefore, when the largest residual value is smaller than or equal to 2, the syntax "great_3" is set to 0.

When it is determined in operation 520 that the syntax "great_3" is 0, in operation 540, the binarization unit 120 binarizes the residual value of the current pixel by using a binary string containing 2 bits. For example, when the prediction value is 0, the largest residual value of the current block is 3 and the residual value of the current pixel is 2, the binarization unit 120 binarizes the residual value of the current pixel into "10" (instead of, into "0010").

When it is determined in operation 520 that the syntax "great_3" is 1, in operation 530, the binarization unit 120 determines whether the syntax "great_7" is 1. The syntax "great_7" is a syntax for determining whether the residual values of the current block can be expressed as 3 bits. When it is determined from the syntax "great_7" that the residual values of the current block can be expressed as 3 bits, the syntax "great_7" is set to 0, and when the residual values of the current block cannot be expressed as 3 bits, the syntax "great_7" is set to 1.

In the example illustrated in FIG. 3, when the binary strings corresponding to all of the residual values of the current block are 0111, i.e., are smaller than a decimal number 7, the residual values can be expressed only as 3 bits. For example, when a prediction value is 0, the binarization control unit 110 selects a binarization table 1. Thus, when the largest residual value among the residual values of the current block is smaller than or equal to 7, the residual values of the current block can be expressed as 3 bits. Therefore, when the largest residual value is smaller than or equal to 7, the syntax "great_7" is set to 0.

When it is determined in operation 530 that the syntax "great_7" is 0, in operation 550, the binarization unit 120 binarizes the residual value of the current pixel by using a binary string containing 3 bits. For example, when the prediction value is 0, the largest residual value of the current block is 7 and the residual value of the current pixel is 4, the binarization unit 120 binarizes the residual value of the current pixel into "100" (instead of, into "0100").

When it is determined in operation 530 that the syntax "great_7" is 1, in operation 560, the binarization unit 120 binarizes the residual value of the current pixel by using all of binary strings containing 4 bits illustrated in FIG. 3.

Binarization of the residual values using only the least bits illustrated in FIG. 5 may be combined with selective addition of sign bits to the binary strings, as described previously with reference to FIG. 4.

In other words, the number of bits in binary strings is determined based on a residual value having the largest absolute value among the residual values of the current block, and the absolute value of the residual value of the current pixel is binarized according to the determined number of bits. Then, only when the absolute value of the residual value is smaller than or equal to the absolute value of the prediction value, may final binary strings be generated by adding a sign bit to the binary string of the residual value of the current pixel.

In addition, FIG. 5 illustrates the case where pixel value is expressed using a binary string containing 4 bits. However, the exemplary embodiment of the present invention can also be applied to the case where the pixel value is expressed using a binary string having a different number of bits. For example, even when the pixel value is expressed using binary strings containing 8 or 16 bits, the exemplary embodiment illustrated in FIG. 5 may be applied to all of methods and apparatuses for binarizing and arithmetic coding a residual value based on a prediction value. In this case, it will be easily understood by one of ordinary skill in the art that syntaxes such as "great_15" and "great_31" can be added.

Referring back to FIG. 1, when the residual value of the current pixel is binarized by the binarization unit 120 to generate a predetermined binary string, the arithmetic coding unit 130 arithmetic codes the binary string. CABAC may be used as the arithmetic coding. CABAC is a coding method by which occurrence probabilities of binary signals that are needed to arithmetic code a binary string are determined based on contexts, i.e., on ambient situations of binary strings, and data is compressed to a theoretical limit of the binary string by using the determined probabilities. The occurrence probabilities of the binary signals are the occurrence probabilities of 0 and 1. Different occurrence probabilities are defined in H.264 CABAC according to a syntax "pStateIdx". The occurrence probability of the binary signals is referred to as a context model. Arithmetic coding is performed by using different context models according to the types of binary strings to be arithmetic coded and the result of arithmetic coding of previously encoded binary strings.

The arithmetic coding unit 130 according to the current exemplary embodiment uses different context models of lower bits included in the binary string according to binary values of upper bits when arithmetic coding the binary string generated by the binarization unit 120. In other words, the upper bits act as contexts of lower bits, which will be described with reference to FIG. 6 in detail. The binarization and the arithmetic coding are performed repeatedly until all the residual values of current block are binarized and arithmetic coded FIG. 6 illustrates contexts of arithmetic coding according to an exemplary embodiment of the present invention. FIG. 6 illustrates contexts of arithmetic coding when a binary string with respect to a residual value of the current pixel, which is generated by the binarization unit 120, is "0110".

Referring to FIG. 6, a context model to be used to arithmetic code the residual value of the current pixel is determined by referring to a context model that is used to arithmetic code previously-encoded blocks adjacent to the current block or a context model that is used to arithmetic code pixels adjacent to the current pixel, and a most significant bit (MSB) '0' is arithmetic coded according to the determined context model.

A second bit '1' is arithmetic coded by using a context model that is determined by using the MSB as a context. In FIG. 6, the binary string is "0110" and thus, a binary value of the upper bit of the second bit is "0". Thus, a context used to arithmetic code the second bit becomes '0'.

A third bit '1' is arithmetic coded by using a context model that is determined by using two upper bits as a context. In FIG. 6, the binary string is "0110" and thus, a binary value of the upper bit of the third bit is "01". Thus, a context used to arithmetic code the third bit becomes '01'.

A least significant bit (LSB) '0' is arithmetic coded by using a context model that is determined by using three upper bits as a context. In FIG. 6, the binary string is "0110" and thus, a binary value of the upper bit of a fourth bit is "011". Thus, a context used to arithmetic code the LSB becomes '011'.

Since a binary value that is closest to a binary value to be arithmetic coded, i.e., a binary value of an upper bit, is used as a context when a lower bit is arithmetic coded, a more exact context model can be determined and the efficiency of arithmetic coding is further enhanced.

Figure 7:
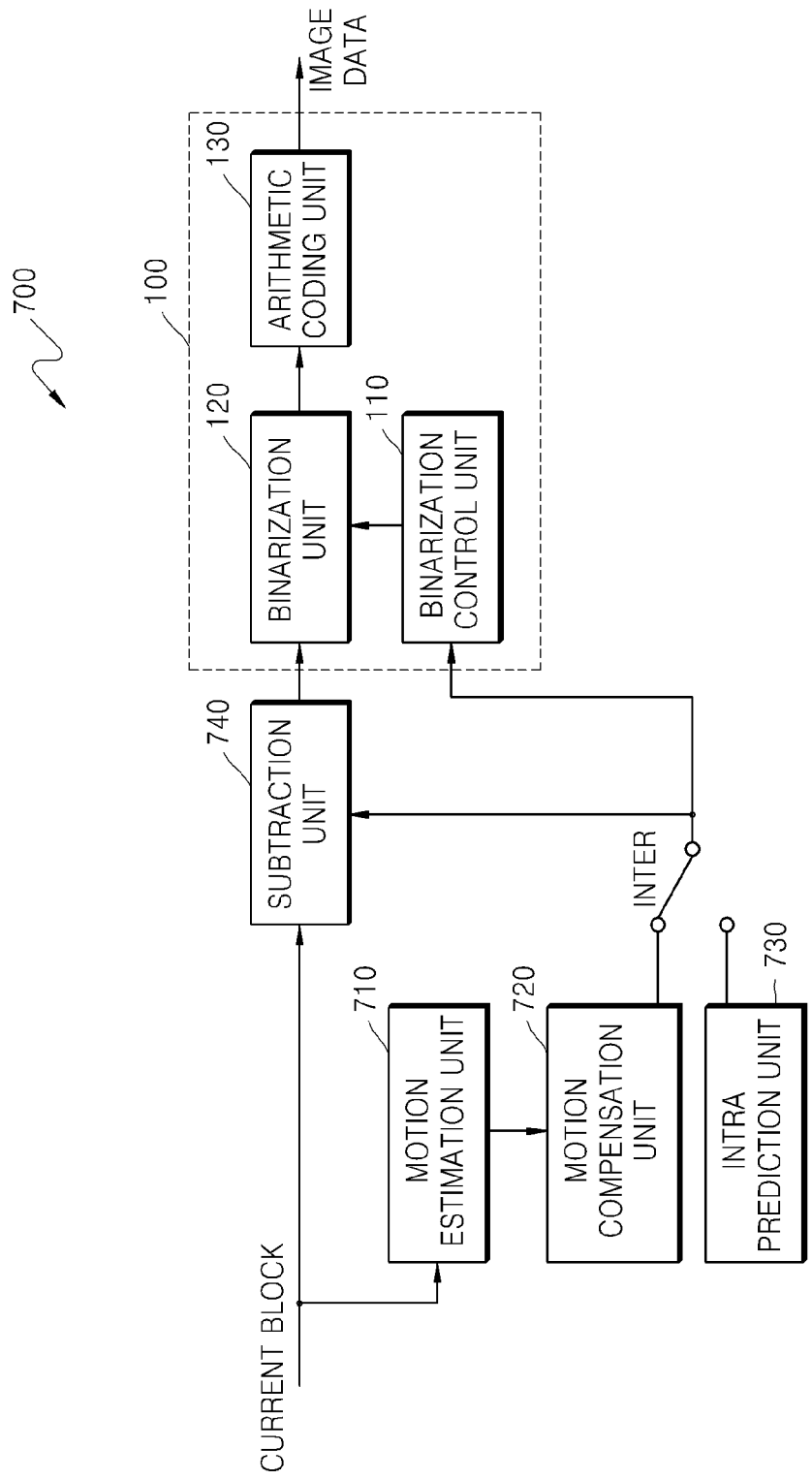
FIG. 7 illustrates a block diagram of an apparatus for encoding an image according to another exemplary embodiment of the present invention.

FIG. 7 illustrates a block diagram of an apparatus 700 for encoding an image according to another exemplary embodiment of the present invention. The apparatus 700 for encoding an image includes the apparatus 100 for encoding an image, illustrated in FIG. 1.

Referring to FIG. 7, the apparatus 700 for encoding an image according to the current exemplary embodiment includes a motion estimation unit 710, a motion compensation unit 720, an intra prediction unit 730, a subtraction unit 740, a binarization control unit 110, a binarization unit 120, and an arithmetic coding unit 130. The binarization control unit 110, the binarization unit 120, and the arithmetic coding unit 130 have been described previously with reference to FIG. 1 and thus, a detailed description thereof will be omitted here.

The motion estimation unit 710 estimates a motion vector of a current block by referring to at least one reference picture. The motion compensation unit 720 generates a prediction block of the current block according to the motion vector that is generated as a result of the estimation performed by the motion estimation unit 710.

The intra prediction unit 730 generates a prediction block of the current block by using pixels included in a previously-encoded region adjacent to the current block. Prediction is performed in a predetermined direction of intra prediction based on a pixel value of the pixels included in the previously-encoded region.

The subtraction unit 740 subtracts the prediction block that is generated by the motion compensation unit 720 or the intra prediction unit 730, from the current block. As a result of the subtraction, a residual block including residual values is generated.

The binarization control unit 110 receives the prediction block including the prediction value of the current pixel and selects a binarization table that is appropriate for binarization of the current pixel, according to FIGS. 2 through 4.

The binarization unit 120 binarizes the residual value of the current pixel by using the binarization table that is selected by the binarization control unit 110. The method of reducing the number of bits in a binary string, which has been described previously with reference to FIG. 5, may be used in binarization.

The arithmetic coding unit 130 arithmetic codes the binary string that is generated by the binarization unit 120. The arithmetic coding method that has been described previously with reference to FIG. 6 may be used. As a result of the arithmetic coding, image data about the current pixel is generated. The binarization and the arithmetic coding are performed repeatedly until all the residual values of current block are binarized and arithmetic coded.

Figure 8:
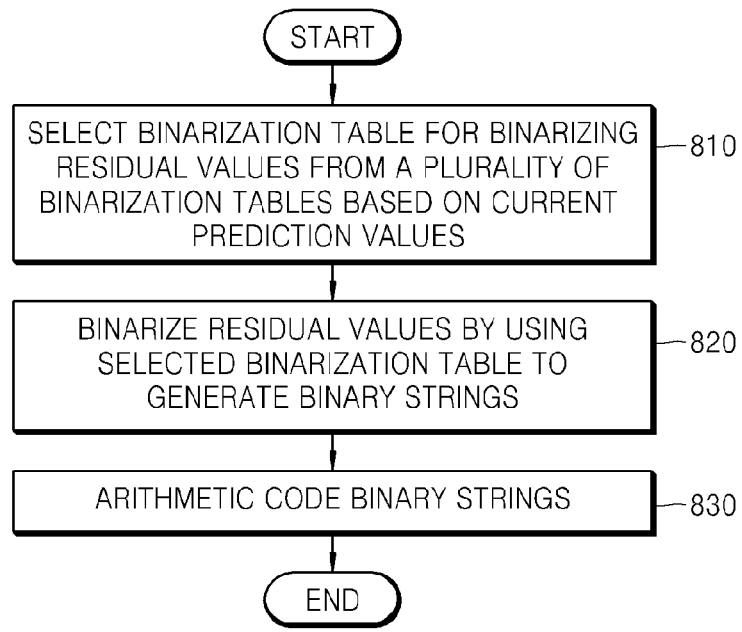
FIG. 8 is a flowchart illustrating a method of encoding an image according to an exemplary embodiment of the present invention.

FIG. 8 is a flowchart illustrating a method of encoding an image according to an exemplary embodiment of the present invention.

Referring to FIG. 8, in operation 810, the apparatus 700 for encoding an image, illustrated in FIG. 7, selects a binarization table for binarizing a residual value of a current pixel from a plurality of binarization tables based on a prediction value of the current pixel. The range of the residual value is determined based on the prediction value of the current pixel, and the binarization table in which the value in the determined range corresponds to the binary strings, is selected from the plurality of binarization tables. The binarization table may include bit strings having the same number of bits that is determined according to the number of the values in the determined range.

In addition, a binarization table including binary strings in which sign bits are added only to values having absolute values that are smaller than or equal to the absolute value of the prediction value, may also be selected. A detailed description related to selection of the binarization table has been described with reference to FIGS. 2 through 4.

In operation 820, the apparatus 700 for encoding an image, illustrated in FIG. 7, binarizes the residual value by using the binarization table that is selected in operation 810 to generate a predetermined binary string. When binarization is performed, the apparatus 700 for encoding an image may be constituted to generate binary strings containing the least number of bits.

In operation 830, the apparatus 700 for encoding an image, illustrated in FIG. 7, arithmetic codes the binary string that is generated in operation 820. As described previously with reference to FIG. 6, the context model is determined by using the binary value of the upper bit of the binary strings as a context of the lower bit, and arithmetic coding may be performed according to the determined context model. The binarization and the arithmetic coding are performed repeatedly until all the residual values of current block are binarized and arithmetic coded.

Figure 9:
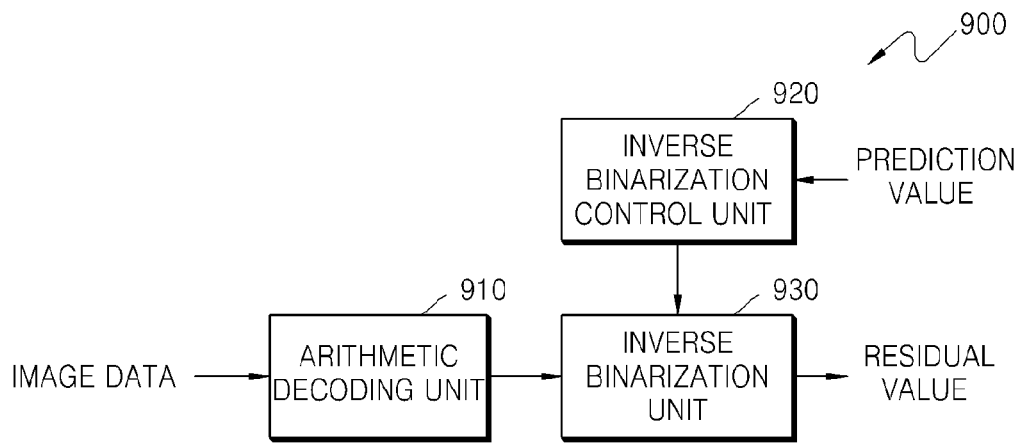
FIG. 9 illustrates a block diagram of apparatus for decoding an image according to an exemplary embodiment of the present invention.

FIG. 9 illustrates a block diagram of an apparatus 900 for decoding an image according to an exemplary embodiment of the present invention. Referring to FIG. 9, the apparatus 900 for decoding an image according to the current exemplary embodiment includes an arithmetic decoding unit 910, an inverse binarization control unit 920, and an inverse binarization unit 930.

The arithmetic decoding unit 910 receives data about a residual value of a current pixel, arithmetic decodes the received data, and generates binary string with respect to the residual value. Arithmetic decoding is a procedure that is opposite to arithmetic coding that has been described previously with reference to the arithmetic coding unit 130 of FIG. 1 and FIG. 6. In arithmetic decoding, compressed binary strings included in data about the residual value is arithmetic decoded to generate a binary string with respect to a residual value before arithmetic coding. As described previously with reference to FIG. 6, when the arithmetic coding unit 130 arithmetic codes lower bits by using upper bits as a context, the arithmetic decoding unit 910 also arithmetic decodes upper bits to determine binary values and arithmetic decodes lower bits according to a context model that is determined by using binary values of the upper bits as a context.

The inverse binarization control unit 920 selects a binarization table for inversely binarizing a bit string with respect to the residual value of current pixel from a plurality of binarization tables based on prediction values of a current pixel. Inverse binarization is a procedure that is opposite to binarization that has been described previously with reference to FIGS. 2 through 4. The inverse binarization control unit 920 selects a binarization table to be used in inverse binarization based on the prediction value of the current pixel so as to perform inverse binarization by referring to the binarization table that is selected by the binarization control unit 110 of FIG. 1.

As described previously with reference to the binarization control unit 110, a binarization table in which values in a range that is determined based on the prediction value correspond to predetermined binary strings, may be selected. In this case, it has already been described with reference to FIG. 3 that the binary strings may be binary strings having the same number of bits.

In addition, as described previously with reference to FIG. 4, a binarization table in which sign bits are added to only binary strings corresponding to values having absolute values that are smaller than or equal to the absolute value of the prediction value may also be selected.

The inverse binarization unit 930 inversely binarizes the binary strings by referring to the binarization table that is selected by the inverse binarization control unit 920, to restore the residual value of the current block. As illustrated in FIG. 5, when the binary string is binarized by minimizing the number of bits in the binary string based on the largest residual value among the residual values of the current block, the binary strings are inversely binarized by referring to syntaxes such as "great_3" and "great_7". The arithmetic decoding and the inverse binarization is performed repeatedly until all the residual values of the current block are restored.

Figure 10:
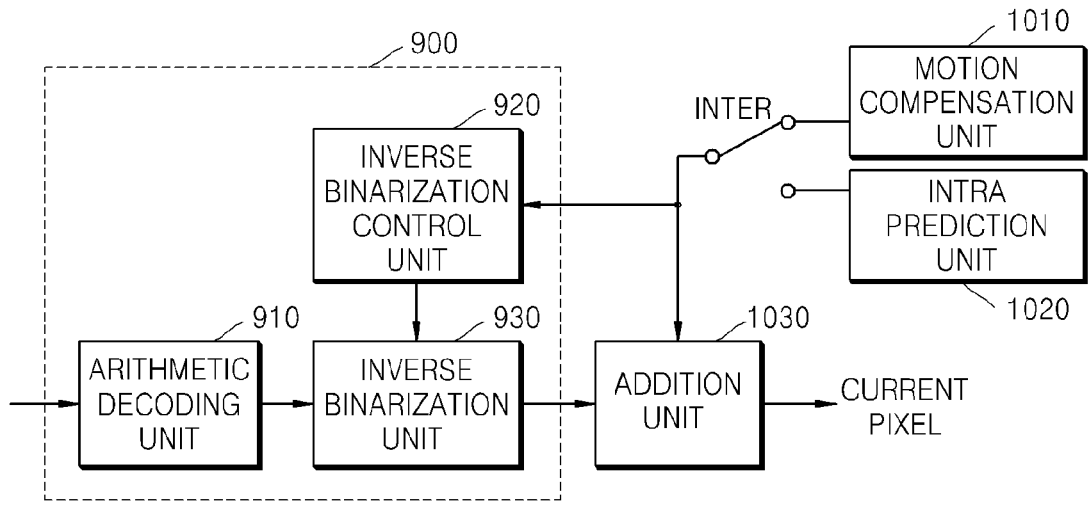
FIG. 10 illustrates a block diagram of an apparatus for decoding an image according to another exemplary embodiment of the present invention.

FIG. 10 illustrates a block diagram of an apparatus for decoding an image according to another exemplary embodiment of the present invention. The apparatus for decoding an image, illustrated in FIG. 10, includes the apparatus 900 for encoding an image, illustrated in FIG. 9.

Referring to FIG. 10, the apparatus 900 for encoding an image of FIG. 9 includes an arithmetic decoding unit 910, an inverse binarization control unit 920, an inverse binarization unit 930, a motion compensation unit 1010, an intra prediction unit 1020, and an addition unit 1030. The arithmetic decoding unit 910, the inverse binarization control unit 920, and the inverse binarization unit 930 have been described with reference to FIG. 9 and thus, a detailed description thereof will be omitted here.

The motion compensation unit 1010 inter predicts the current block according to a motion vector so as to generate a prediction block of the current block. The motion vector that is encoded in image data is decoded, and a reference block is searched from a reference picture based on the decoded motion vector. The current block is inter predicted based on the searched reference block.

The intra prediction unit 1020 intra predicts the current block based on pixels included in a previously-encoded region adjacent to the current block. Intra prediction is performed in a direction of intra prediction that is determined based on a pixel value of adjacent pixels during encoding of the current block.

The arithmetic decoding unit 910 receives data about a residual value of the current pixel and arithmetic decodes the data. As a result of the arithmetic decoding, a binary string with respect to the residual value are generated.

The inverse binarization control unit 920 selects a binarization table for inversely binarizing the bit string with respect to the residual value of the current pixel from a plurality of binarization tables based on a prediction value of the current pixel.

The inverse binarization unit 930 inversely binarizes the bit strings with respect to the residual value by using the binarization table that is selected by the inverse binarization control unit 920. As a result of inverse binarization, the residual value with respect to the current pixel is restored, and the restored residual value is added by the addition unit 1030 to the prediction value and is restored to the current pixel. The arithmetic decoding and the inverse binarization are performed repeatedly until all the residual values of current block are restored.

Figure 11:
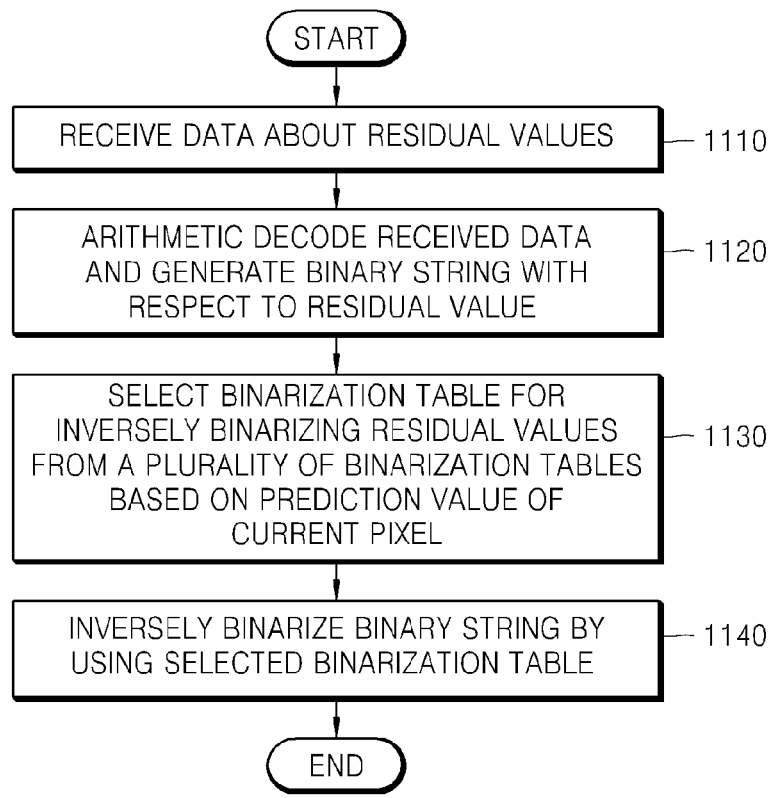
FIG. 11 is a flowchart illustrating a method of decoding an image according to an exemplary embodiment of the present invention.

FIG. 11 is a flowchart illustrating a method of decoding an image according to an exemplary embodiment of the present invention.

Referring to FIG. 11, in operation 1110, the apparatus for decoding an image, illustrated in FIG. 10, receives data with respect to a residual value that are obtained by subtracting a prediction value from a pixel value of a current pixel. A binarization table for binarizing the residual value is selected based on the prediction value, and data that is generated by arithmetic coding binary strings that are generated according to the selected binarization table is received.

In operation 1120, the apparatus for decoding an image, illustrated in FIG. 10, arithmetic decodes the data that is received in operation 1110, to generate a binary string with respect to the residual value of the current pixel. Arithmetic decoding may be performed by performing a procedure that is opposite to the arithmetic coding method described previously with reference to FIG. 6.

In operation 1130, the apparatus for decoding an image, illustrated in FIG. 10, selects a binarization table for inversely binarizing a residual value of the current pixel from a plurality of binarization tables based on the prediction value of the current pixel. The range of the residual value is determined based on the prediction value of the current pixel, and a binarization table in which the values in the determined range correspond to predetermined binary strings, is selected from a plurality of binarization tables. A detailed description thereof has already been given with reference to FIGS. 2 through 4.

In operation 1140, the apparatus for decoding an image, illustrated in FIG. 10, inversely binarizes the binary string by using the binarization table that is selected in operation 1130. The arithmetic decoding and the inverse binarization are performed repeatedly until all the residual values of current block are restored.

The invention can also be embodied as computer readable codes on a computer readable recording medium. The computer readable recording medium is any data storage device that can store data which can be thereafter read by a computer system.

Examples of the computer readable recording medium include read-only memory (ROM), random-access memory (RAM), CD-ROMs, magnetic tapes, floppy disks, and optical data storage devices. In other exemplary embodiments, the computer readable recording medium may include carrier waves (such as data transmission through the Internet). The computer readable recording medium can also be distributed over network coupled computer systems so that the computer readable code is stored and executed in a distributed fashion.

While this invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. A method of encoding an image in an apparatus for encoding an image, the method comprising:
    selecting a binarization table for binarizing a residual value that is obtained by subtracting a prediction value of a current pixel from a pixel value of the current pixel, from a plurality of binarization tables in which residual values in a range of the residual value that is determined based on the prediction value of the current pixel correspond to binary strings;
    binarizing the residual value by using the selected binarization table and generating a binary string; and
    arithmetic coding the binary string.

2. The method of claim 1, wherein the selecting of the binarization table comprises selecting the binarization table in which residual values in a range of the residual value where the residual values are smaller than or equal to a value that is obtained by subtracting the prediction value from a maximum value of the pixel value of a current pixel and where the residual values are greater than or equal to a negative value of the prediction value, correspond to predetermined binary strings.

3. The method of claim 2, wherein each of the predetermined binary strings comprises a same number of bits.

4. The method of claim 2, wherein the generating of the binary string comprises:
   determining a number of bits that are needed to binarize residual values of a current block, based on a largest residual value of the residual values of the current block; and
   binarizing the residual value of the current pixel into the binary string having the determined number of bits by using the selected binarization table.

5. The method of claim 1, wherein a binary string corresponding to a residual value having an absolute value that is smaller than or equal to an absolute value of the prediction value comprises sign bits.

6. The method of claim 1, wherein the arithmetic coding of the binary string comprises arithmetic coding a lower bit of the generated binary string by using a context model which is different according to a binary values of upper bits of the generated binary string.

7. An apparatus for encoding an image, the apparatus comprising:
   a binarization control unit which selects a binarization table for binarizing a residual value that is obtained by subtracting a prediction value of a current pixel from a pixel value of the current pixel, from a plurality of binarization tables in which residual values a range of the residual value that is determined based on the prediction value of the current pixel correspond to binary strings;
   a binarization unit which binarizes the residual value by using the selected binarization table and generates a binary string; and
   an arithmetic coding unit which arithmetic codes the binary string.

8. The apparatus of claim 7, wherein the binarization control unit selects a binarization table in which residual values in a range of the residual value where the residual values are smaller than or equal to a value that is obtained by subtracting the prediction value from a maximum value of the pixel value of a current pixel and where the residual values are greater than or equal to a negative value of the prediction value, correspond to predetermined binary strings.

9. The apparatus of claim 8, wherein each of the predetermined binary strings comprises a same number of bits.

10. The apparatus of claim 7, wherein a binary string corresponding to a residual value having an absolute value that is smaller than or equal to absolute value of the prediction value comprise sign bits.

11. A method of decoding an image in an apparatus for decoding an image, the method comprising:
    receiving data of a residual value that are obtained by subtracting a prediction value of a current pixel from a pixel value of the current pixel, arithmetic decoding the received data, and generating a binary string from the residual value;
    selecting a binarization table for inversely binarizing the residual value from a plurality of binarization tables in which residual values in a range of the residual value that is determined based on the prediction value of the current pixel correspond to binary strings; and
    inversely binarizing the binary string by using the selected binarization table.

12. The method of claim 11, wherein the selecting of the binarization table comprises selecting the binarization table in which residual values in a range of the residual value where the residual values are smaller than or equal to a value that is obtained by subtracting the prediction value from a maximum value of the pixel value of a current pixel and where the residual values are greater than or equal to a negative value of the prediction value, correspond to predetermined binary strings.

13. The method of claim 12, wherein each of the predetermined binary strings comprises a same number of bits.

14. The method of claim 12, wherein the inverse binarizing of the binary string comprises inversely binarizing the binary string that is binarized as a predetermined number of bits that are determined based on a largest residual value among residual values of a current block, by using the selected binarization table.

15. The method of claim 11, wherein a binary string corresponding to a residual value having an absolute value that is smaller than or equal to an absolute value of the prediction value comprises sign bits.

16. The method of claim 11, wherein the generating of the binary strings comprises arithmetic decoding a lower bit of data of the residual value by using a context model which is different according to binary values of upper bits.

17. An apparatus for decoding an image, the apparatus comprising:
    an arithmetic decoding unit which receives data of a residual value that is obtained by subtracting a prediction value of a current pixel from a pixel value of the current pixel, arithmetic decoding the received data, and generating a binary string from the residual value;
    an inverse binarization control unit which selects a binarization table for inversely binarizing the residual value from a plurality of binarization tables in which residual values in a range of the residual value that is determined based on the prediction value of the current pixel correspond to binary strings; and
    an inverse binarization unit which inversely binarizes the binary string by using the selected binarization table.

18. The apparatus of claim 17, wherein the inverse binarization control unit selects the binarization table in which residual values in a range of the residual value where the residual values are smaller than or equal to a value that is obtained by subtracting the prediction value from a maximum value of the pixel value of a current pixel and where the residual values are greater than or equal to a negative value of the prediction value, correspond to predetermined binary strings.

19. The apparatus of claim 18, wherein each of the predetermined binary strings comprises a same number of bits.

20. The apparatus of claim 17, wherein a binary string corresponding to a residual value having an absolute value that is smaller than or equal to an absolute value of the prediction value comprises sign bits.

21. A non-transitory computer readable recording medium having recorded thereon a program for executing the method of claim 1.

22. A non-transitory computer readable recording medium having recorded thereon a program for executing the method of claim 11.

* * * * *